(12) United States Patent
Cotter et al.

(10) Patent No.: US 7,863,996 B2
(45) Date of Patent: Jan. 4, 2011

(54) TUNE RANGE LIMITER

(75) Inventors: Daniel H. Cotter, Macedon, NY (US); Sean O. Harnett, Penfield, NY (US)

(73) Assignee: MKS Instruments, Inc., Wilmington, MA (US)

(*) Notice: Subject to any disclaimer, the term of this patent is extended or adjusted under 35 U.S.C. 154(b) by 273 days.

(21) Appl. No.: 12/236,716

(22) Filed: Sep. 24, 2008

(65) Prior Publication Data

US 2010/0073104 A1    Mar. 25, 2010

(51) Int. Cl.
*H03H 7/38*    (2006.01)
(52) U.S. Cl. ...................................... 333/17.3
(58) Field of Classification Search ............... 333/17.3, 333/32
See application file for complete search history.

(56) References Cited

U.S. PATENT DOCUMENTS

| | | | |
|---|---|---|---|
| 4,679,007 A * | 7/1987 | Reese et al. ............ | 333/17.3 |
| 5,793,162 A * | 8/1998 | Barnes et al. ........... | 315/111.21 |
| 7,332,980 B2 * | 2/2008 | Zhu et al. ................ | 333/17.3 |
| 2010/0164641 A1 * | 7/2010 | McKinzie, III ......... | 333/17.3 |

* cited by examiner

*Primary Examiner*—Stephen E Jones
(74) *Attorney, Agent, or Firm*—Harness, Dickey & Pierce, P.L.C.

(57) ABSTRACT

An impedance matching network includes a first input port that receives radio frequency (RF) power and includes an input impedance, an output port that provides the RF power and includes an output impedance, and a variable capacitance module that varies the output impedance. The variable capacitance module includes a first variable capacitor, a second variable capacitor, a first motor, and a second motor that adjusts a capacitance of the second variable capacitor. A relationship between a desired value of the capacitance and an actual value of the capacitance is dependent on a capacitance of the first variable capacitor.

21 Claims, 7 Drawing Sheets

130

| Tune Range Corners: Tuning Capacitor 18 Position % | Adjust: |
|---|---|
| 0, 0 | $C_{1Offset0}, C_{2Offset0}$ |
| 100%, 0 | $C_{1Gain0}, C_{2Offset1}$ |
| 100%, 100% | $C_{1Gain1}, C_{2Gain1}$ |
| 0, 100% | $C_{2Gain0}, C_{1Offset1}$ |

132 — first column header
135 — second column header

FIG. 6

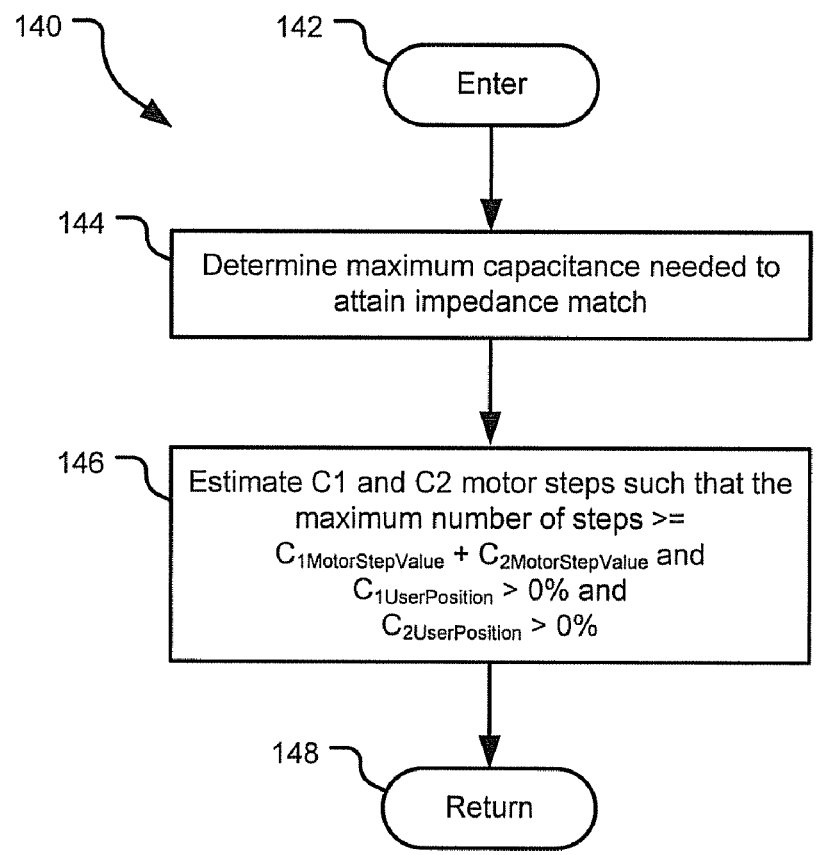

140

142 — Enter

144 — Determine maximum capacitance needed to attain impedance match

146 — Estimate C1 and C2 motor steps such that the maximum number of steps >= $C_{1MotorStepValue} + C_{2MotorStepValue}$ and $C_{1UserPosition} > 0\%$ and $C_{2UserPosition} > 0\%$ 148 — Return

FIG. 7

TUNE RANGE LIMITER

FIELD

The present disclosure relates to controlling an impedance match between an output and an input of respective radio frequency (RF) devices.

BACKGROUND

The statements in this section merely provide background information related to the present disclosure and may not constitute prior art.

Referring now to FIG. 1, a functional block diagram is shown of a plasma processing system 10. Plasma processing system 10 includes RF generator 12 that provides RF power for a plasma chamber 14. A matching network 16 communicates the RF power to plasma chamber 14. Matching network 16 includes a variable capacitance module 26 that determines a tuning range and resolution of impedances for matching network 16.

Referring briefly to FIG. 2, a schematic diagram is shown of a portion of variable capacitance module 26. Variable capacitance module 26 includes a first adjustable capacitor 18-1 and a second adjustable capacitor 18-2, collectively referred to as capacitors 18. Capacitors 18 are adjusted by respective stepper motors 20-1 and 20-2 such that an output impedance of matching network 16 matches an input impedance of plasma chamber 14.

Returning to FIG. 1, matching network 16 includes a phase and magnitude detection module 22. Phase and magnitude detection module 22 generates signals based on respective ones of the phase and magnitude of the RF power from RF generator 12. Phase and magnitude detection module 22 communicates the signals to a control module 24 and communicates the RF power to variable capacitance module 26. Variable capacitance module 26 communicates the RF power to fixed inductance and capacitance (LC) module 28. Fixed LC module 28 cooperates with variable capacitance module 26 to vary the impedance of matching network 16. Fixed LC module 28 also communicates the RF power to an output sensing module 30. Output sensing module 30 generates signals based on the respective magnitude and/or phase of the RF power that is communicated to plasma chamber 14. The signals are communicated to a performance monitoring module 32 that performs diagnostic monitoring functions.

Control module 24 also generates stepper motor control signals that are communicated to respective ones of motors 20. The stepper motor control signals are based on the signals from phase and magnitude detection module 22, performance monitoring module 32, and/or user input settings.

Referring now to FIG. 3A, a graph 40 shows a relationship between a user input setting for capacitor 18-1 and an associated number of steps or position for motor 20-1. The user input setting for 100% capacitance is shown at 42. The user input setting for 0% capacitance is shown at 44. A vertical axis 46 indicates the number of steps for motor 20-1. A horizontal axis 48 indicates the number of steps for motor 20-2. Graph 40 shows that the user input settings (e.g. 42 and 44) for capacitor 18-1 are associated with respective numbers of steps for motor 20-1 independent of the position of motor 20-2 (and hence, the capacitance of capacitor 18-2).

Referring now to FIG. 3B, a graph 50 shows a relationship between a user input setting for capacitor 18-2 and the associated number of steps or position of motor 20-2. The user input setting for 100% capacitance is shown at 52. The user input setting for 0% capacitance is shown at 54. A vertical axis 56 indicates the number of steps for motor 20-2. A horizontal axis 58 indicates the number of steps for motor 20-1. Graph 50 shows that the user input settings (e.g. 52 and 54) for capacitor 18-2 are associated with respective numbers of steps for motor 20-2 independent of the position of motor 20-1 (and hence, the capacitance of capacitor 18-1).

Referring now to FIG. 4, a Smith chart 60 illustrates an effect of the motor position and capacitance relationships that are shown in FIGS. 3A and 3B. Generally the minimum and maximum capacitances of capacitors 18 are chosen such that matching network 16 has enough range to allow tuning to several impedances on the Smith chart 60. An example tuning range is shown at 62. The range 62 may be much larger than what is needed to tune to a single impedance 64 during operation. Since range 62 may be larger than what is needed the adjustment resolutions of capacitors 18 may also be more coarse than necessary.

SUMMARY

An impedance matching network includes a first input port that receives radio frequency (RF) power and includes an input impedance, an output port that provides the RF power and includes an output impedance, and a variable capacitance module that varies the output impedance. The variable capacitance module includes a first variable capacitor, a second variable capacitor, a first motor, and a second motor that adjusts a capacitance of the second variable capacitor. A relationship between a desired value of the capacitance and an actual value of the capacitance is dependent on a capacitance of the first variable capacitor.

In other features the first and second motors are stepper motors. The impedance matching network further includes a control module that determines the desired value based on a portion of the RF power that is reflected from a load that is driven by the output port. The control module drives the second motor. The control module includes a lookup table that is stored in a memory and represents the relationship between the desired and actual values of the capacitance.

In other features the relationship between the desired and actual values of the capacitance is described by a polynomial relationship. The relationship between the desired and actual values of the capacitance can also be described by a piecewise linear relationship.

An impedance matching network includes a first input port that receives radio frequency (RF) power and includes an input impedance, an output port that provides the RF power and includes an output impedance, and a variable capacitance circuit that varies the output impedance. The variable capacitance circuit includes a first variable capacitor, a second variable capacitor, and a first motor that includes an output shaft that rotates to a first position. The first position corresponds with a first capacitance of the first variable capacitor. A second motor includes an output shaft that rotates to a second position. The second position corresponds with a second capacitance of the second variable capacitor. A relationship between a desired value of the first capacitance and an actual value of the first capacitance is dependent on the second position.

In other features a relationship between a desired value of the second capacitance and an actual value of the second capacitance is dependent on the first position. The first and second motors are stepper motors. The impedance matching network also includes a control module that determines the desired value based on a portion of the RF power that is reflected from a load that is driven by the output port. The control module determines the first and second positions. The control module includes a lookup table that is stored in memory and represents the relationship between the desired and actual values of the capacitance.

In other features the relationship between the desired and actual values of the first capacitance is described by a polynomial equation. The relationship between the desired and actual values of the first capacitance may also be described by a piecewise linear equation.

A method of operating an impedance matching network includes receiving radio frequency (RF) power via an input that includes an input impedance, providing the RF power at an output that includes an output impedance, and adjusting first and second capacitances to vary the output impedance. A relationship between a desired value of the second capacitance and an actual value of the second capacitance is dependent on the value of the first capacitance.

In other features adjusting first and second capacitances includes driving respective first and second motors to positions that determine the respective first and second capacitances. The method includes determining the desired value based on a portion of the RF power that is reflected from a load that is driven by the output port. The method includes storing a lookup table in a computer memory. The lookup table represents the relationship between the desired and actual values of the second capacitance.

In other features the relationship between the desired and actual values of the second capacitance is described by a polynomial relationship. The relationship between the desired and actual values of the capacitance may also be described by a piecewise linear relationship.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 6 is a chart of adjustment points for the relationships of FIGS. 5A and 5B;

FIG. 7 is a flowchart for determining the positions of the adjustable tuning capacitors of FIG. 2;

DETAILED DESCRIPTION

Figure 1:
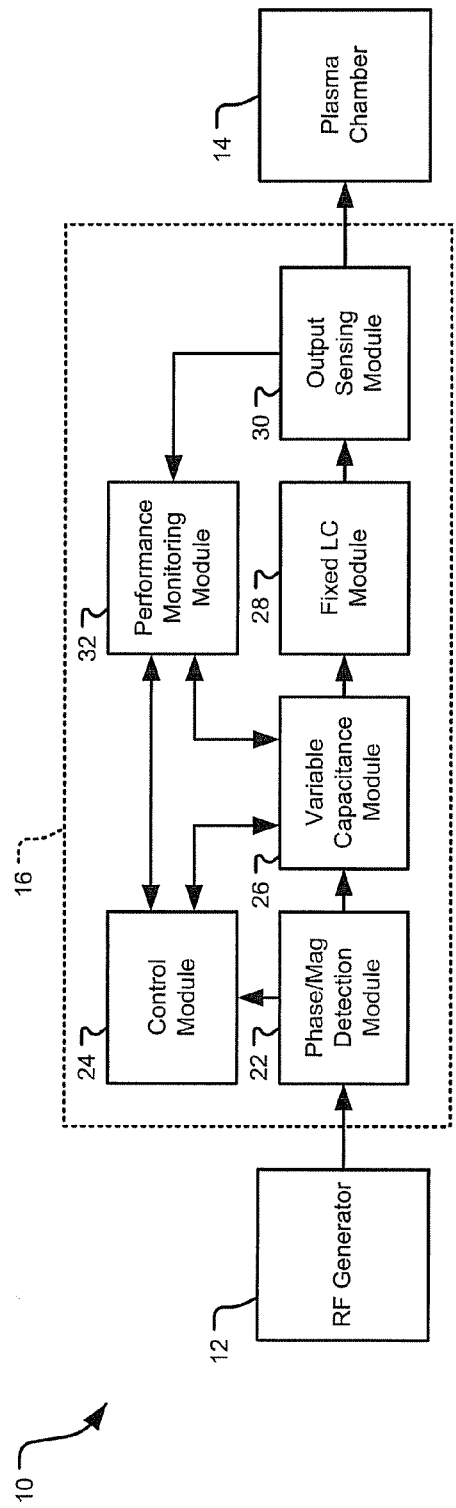
FIG. 1 is a functional block diagram of a radio frequency plasma processing system.
Figure 2:
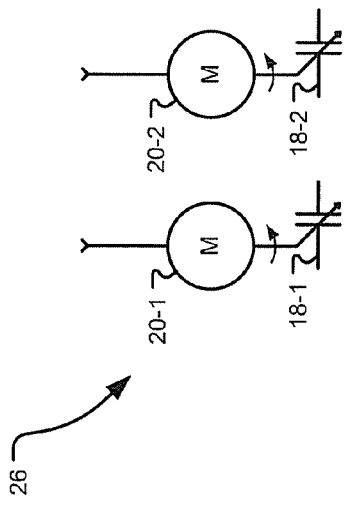
FIG. 2 is a schematic drawing of adjustable tuning capacitors and associated stepper motors.

The following description is merely exemplary in nature and is not intended to limit the present disclosure, application, or uses. It should be understood that throughout the drawings, corresponding reference numerals indicate like or corresponding parts and features.

Figure 5A:
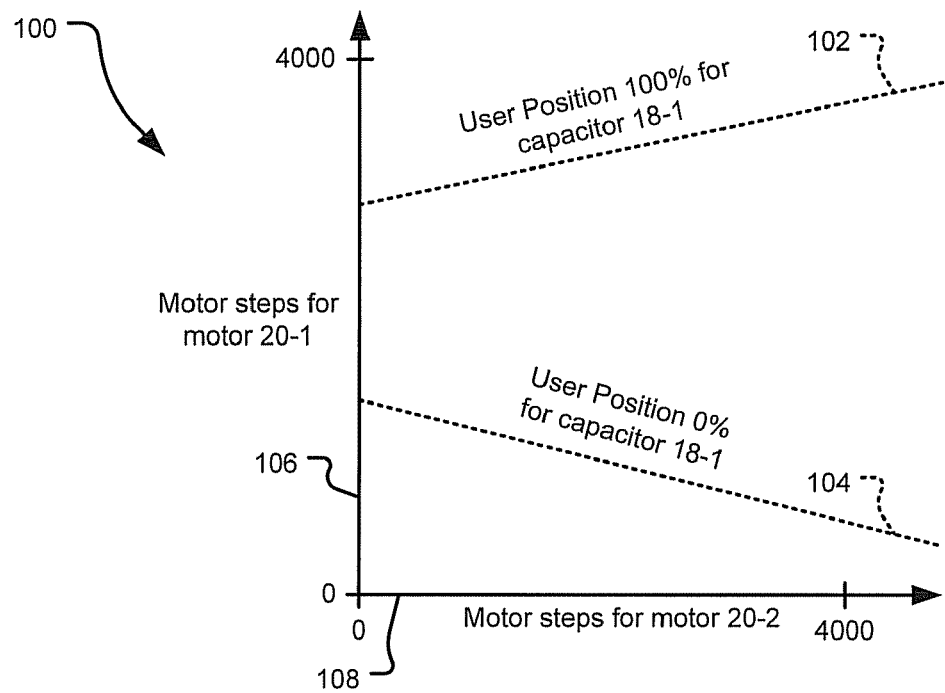
FIGS. 5A and 5B are graphs that show sloped relationships between desired positions and actual positions of the adjustable tuning capacitors of FIG. 2.
Figure 5B:
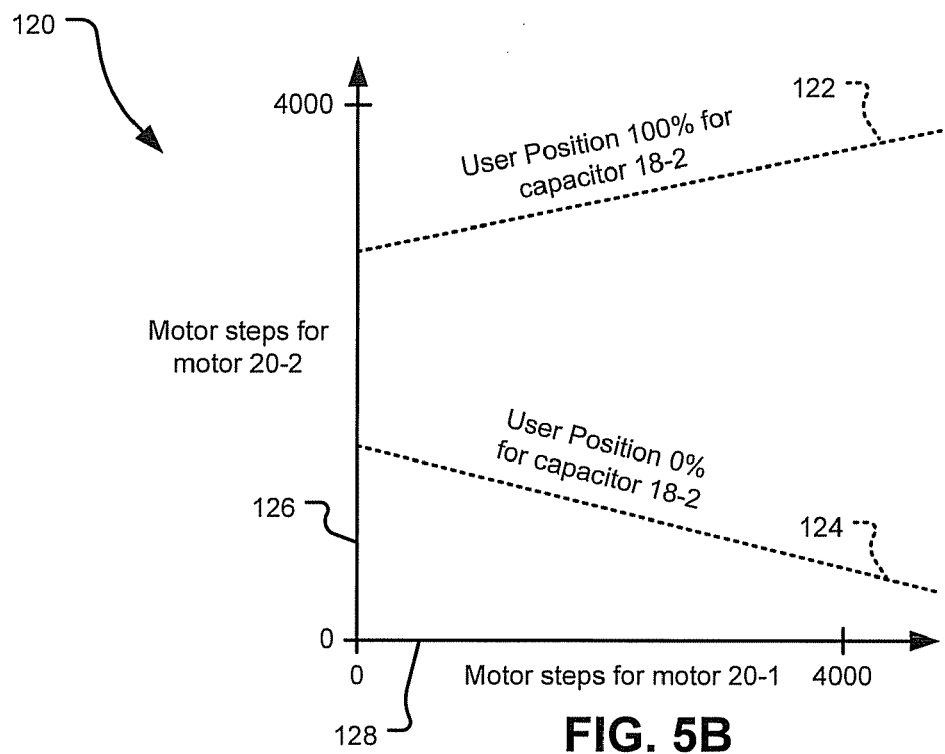

Referring now to FIGS. 5A and 5B, graphs 100 and 120 show one of various embodiments of relationships between user input settings for capacitors 18 and associated number of steps for respective motors 20. The relationships determine the number of motor steps or positions of each motor 20 based on the user input settings and the number of motor steps of the other one of motors 20. The relationships allow matching network 16 to tune to a wide range of impedances while also providing improved tuning resolution around a particular impedance. The user input settings can be generated by control module 24 of FIG. 1. As shown the user input settings are scaled as a percentage of maximum capacitance of respective capacitors 18, however it should be appreciated that other scales may also be used.

Referring now to FIG. 5A, graph 100 shows relationships that can be used to determine the position of motor 20-1 and, consequently, the capacitance of capacitor 18-1. The user input setting for 100% capacitance of capacitor 18-1 is shown at 102. The user input setting for 0% capacitance of capacitor 18-1 is shown at 104. A vertical axis 106 indicates the number of steps for motor 20-1. A horizontal axis 108 indicates the number of steps for motor 20-2. Graph 100 shows that for a given user input setting (e.g. 102 or 104) the position of motor 20-1 is dependent on the user input setting and the position of motor 20-2. If the user input setting is between 0% and 100% then the number of motor steps can be interpolated from relationships 102 and 104.

Referring now to FIG. 5B, graph 120 shows relationships that can be used to determine the position of motor 20-2 and, consequently, the capacitance of capacitor 18-2. The user input setting for 100% capacitance of capacitor 18-2 is shown at 122. The user input setting for 0% capacitance of capacitor 18-2 is shown at 124. A vertical axis 126 indicates the number of steps for motor 20-2. A horizontal axis 128 indicates the number of steps for motor 20-1. Graph 120 shows that for a given user input setting for capacitor 18-2 (e.g. 122 or 124) the position of motor 20-2 is dependent on the user input setting and the position of motor 20-1.

Graphs 100 and 120 can be implemented as look-up tables that are stored in a computer-readable memory. The memory can be included in control module 24. In other embodiments control module 24 can include a computer program that is stored in a computer-readable memory. The computer program can be executed by a processor. The processor can be included with control module 24. The computer program can implement graphs 100 and 120 with respective equations. One set of equations can estimate the position of motor 20-1 and another set of equations can estimate the position of motor 20-2. Each set of equations can take the form $$C_{1UserPosition} = C_{1MotorStepValue} * C_{1Gain} + C_{1Offset}, \quad (1)$$

where $C_{1UserPosition}$ is the user input setting for the capacitor 18 of interest, $C_{1MotorStepValue}$ is the number of steps of the motor 20 that is associated with the capacitor 18 of interest, and $C_{1Gain}$ and $C_{1Offset}$ are point-slope equation variables that can be determined based on the equations $$C_{1Gain}=((100-C_{2Position})/100)*C_{1Gain0}+(C_{2Position}/100)*C_{1Gain1} \text{ and} \quad (2)$$

$$C_{1Offset}=((100-C_{2Position})/100)*C_{1Offset0}+(C_{2Position}/100)*C_{1Offset1}. \quad (3)$$

$C_{2Position}$ is the position of the stepper motor 20 that is associated with the other one of the capacitors 18. $C_{1Gain0}$ and $C_{1Gain1}$ are respective slopes.

Referring now to FIG. 6, a chart 130 lists endpoints of position relationships (e.g. 102 and 104, or 122 and 124) and corresponding variables that determine the locations of the endpoints. Chart 130 includes a first column 132 and a second column 134. First column 132 lists the endpoints of the relationship of interest (e.g. 102 and 104, or 122 and 124). Second column 134 lists the corresponding variables that determine the positions of the relationship of interest. The variables can be changed to provide a desired combination of tuning range and/or resolution for tuning capacitors 18.

Referring now to FIG. 7, a flowchart illustrates a method 140 for estimating the positions of motors 20. Method 140 can be implemented as computer-readable instructions that are stored in computer memory associated with control module 24. The instructions can be executed by a processor that can also be included with control module 24.

Control enters through block 142 and proceeds to block 144. In block 144 control determines a maximum capacitance that is needed from variable capacitance module 26 (see FIG. 1). The maximum capacitance can be determined based on the inductance and/or capacitance of fixed LC module 28 and an anticipated scope of impedance mismatches between the output of RF generator 12 and the input of plasma chamber 14. Control then proceeds to block 146 and estimates the capacitances that are needed from adjustable capacitors C18. The capacitances can be represented as a number of motor steps (e.g. motor position) of motor 20. Control may estimate the capacitances and associated motor steps by solving equation (1) above for each capacitor C18 while simultaneously satisfying the conditions that 1) neither capacitor 18 is allowed to be at 0% capacitance and 2) a sum of the positions of motors 20 is less than or equal to the maximum number of steps that was determined in block 144. Control then returns to other processes via block 148.

Figure 3A:
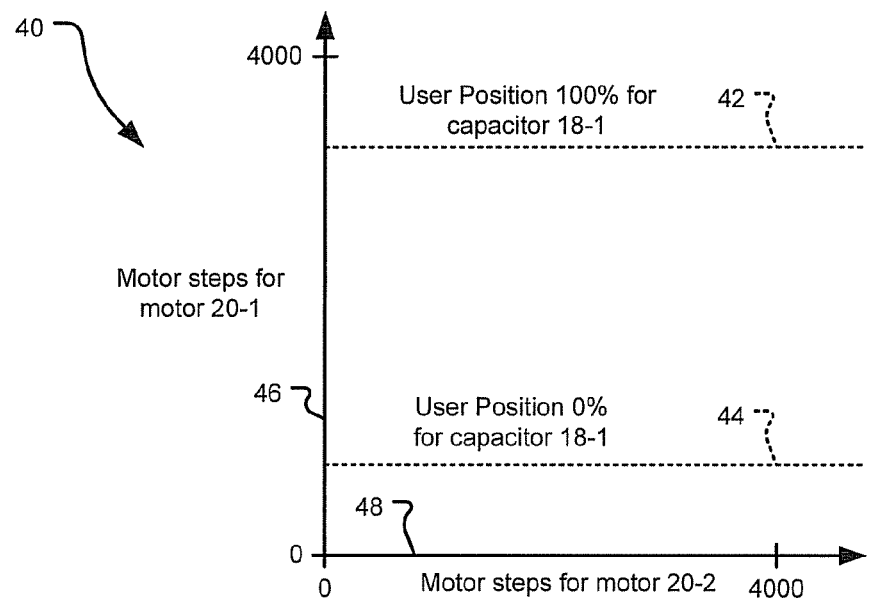
FIGS. 3A and 3B are graphs that show relationships between desired positions and actual positions of the adjustable tuning capacitors of FIG. 2.
Figure 3B:
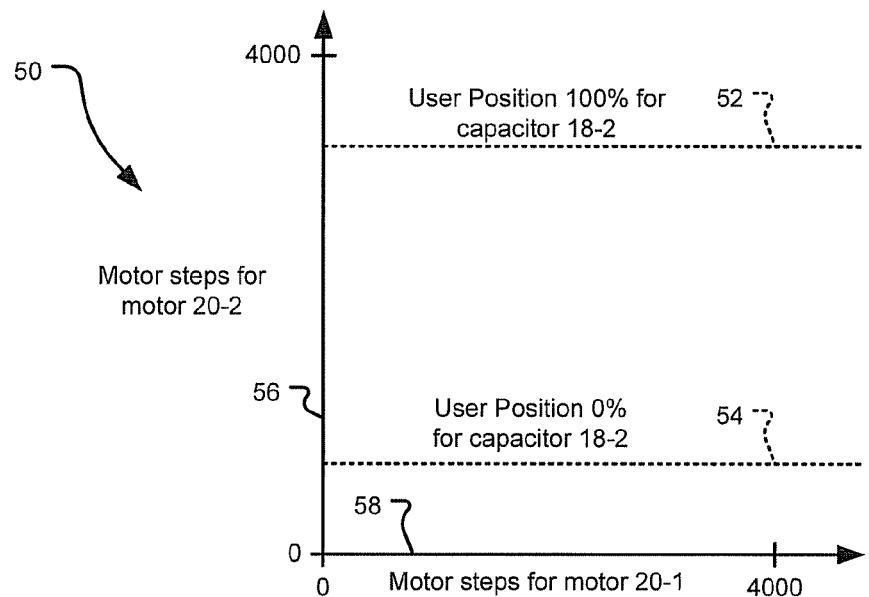
Figure 4:
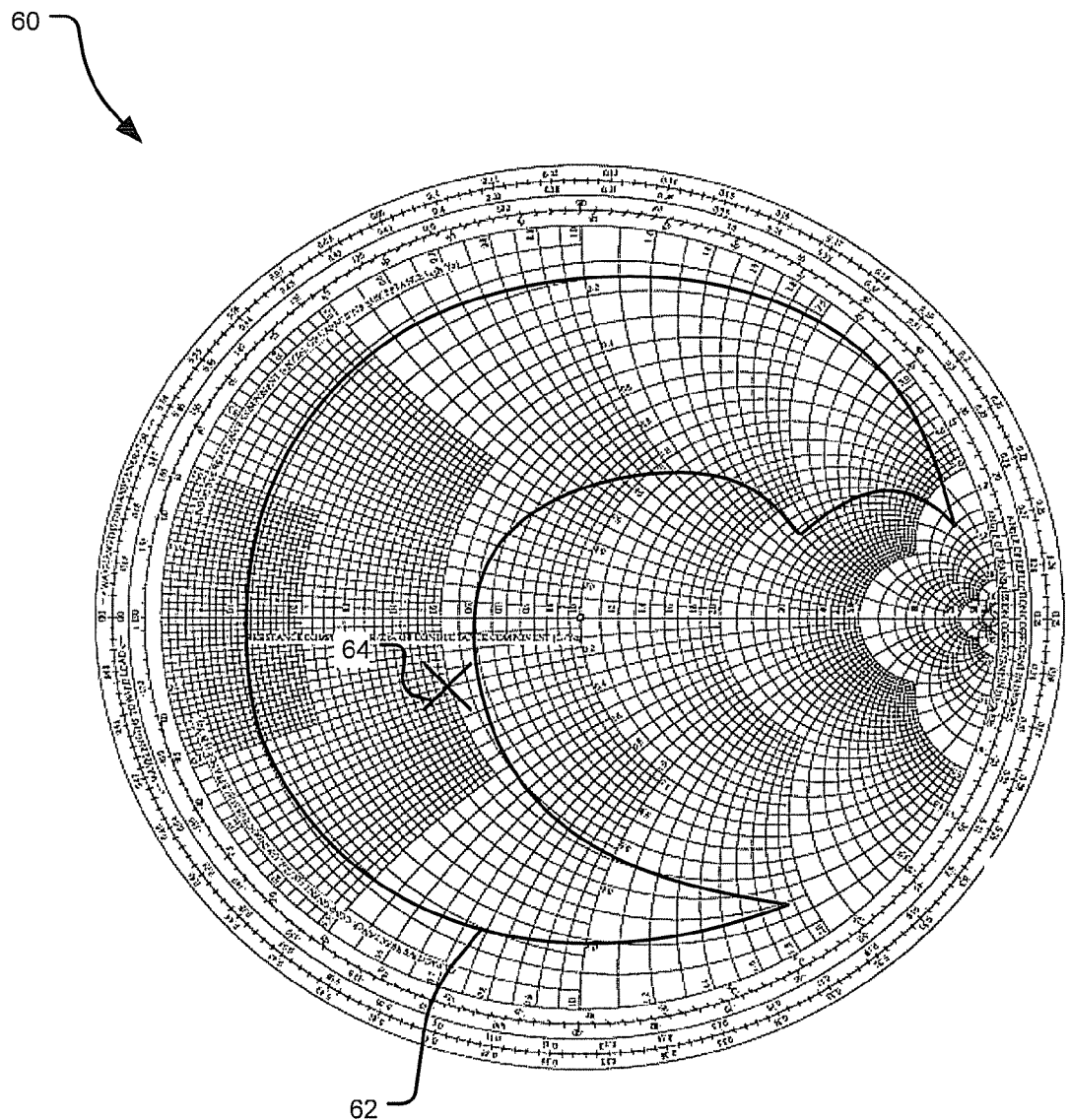
FIG. 4 is a Smith chart that shows a tuning range of a match network that employs the adjustable tuning capacitors and the relationships of FIGS. 3A and 3B.
Figure 8:
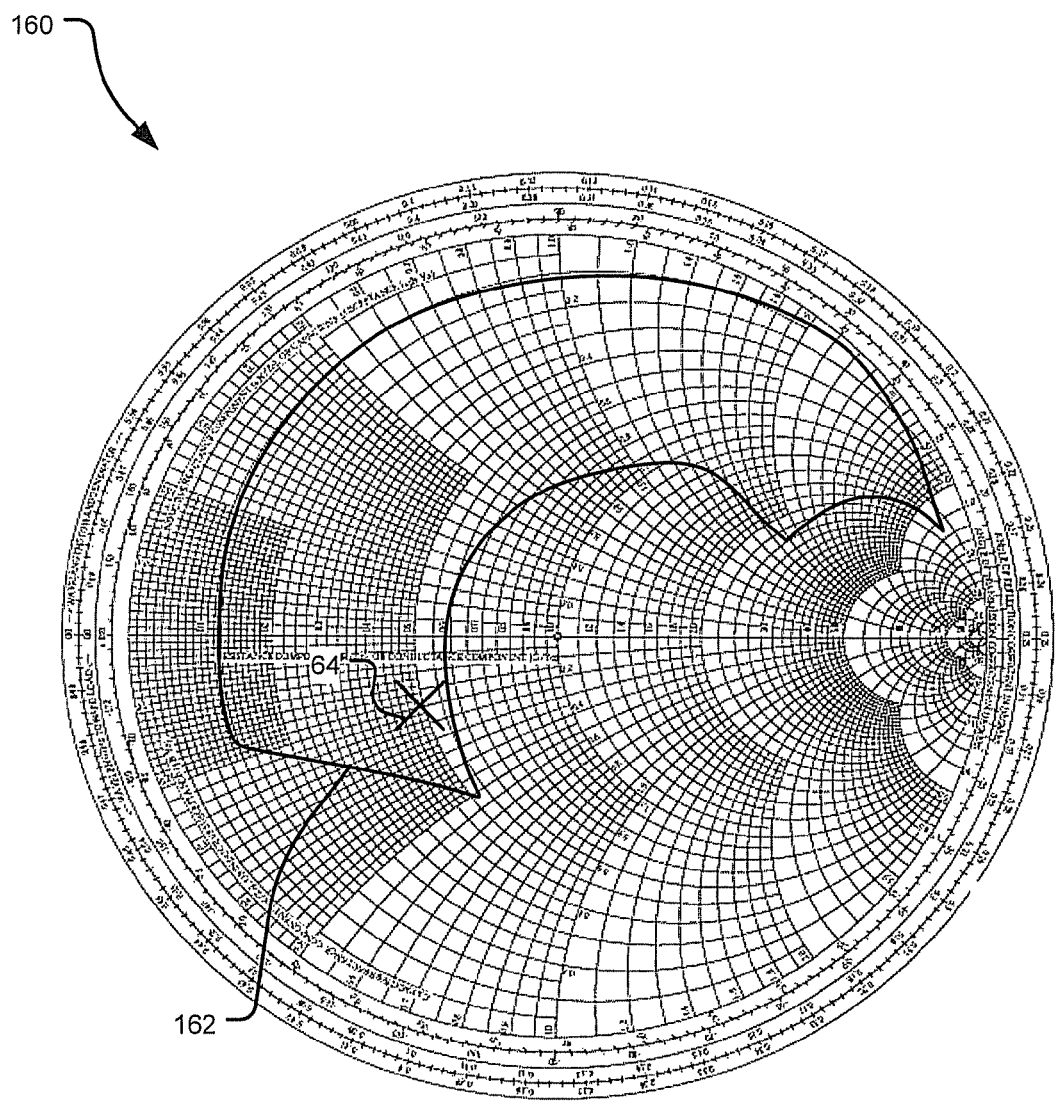
FIG. 8 is a Smith chart that shows a tuning range of a match network that employs the adjustable tuning capacitors and the relationships of FIGS. 5A and 5B.

Referring now to FIG. 8, a Smith chart 160 illustrates a tuning range 162. Tuning range 162 is a result of the motor position and capacitance relationships that are shown in FIGS. 3A and 3B together with method 140. Comparing tuning range 162 to tuning range 62 (FIG. 4) of the prior art, it can be seen that circuits and methods that are disclosed herein limit the tuning range in the capacitive region (bottom half) of Smith chart 160. The tune range has therefore been made considerably smaller while allowing the impedance 64 to be reached. By limiting the tune range a unit-to-unit repeatability between a plurality of matching networks 16 should be increased. Also the conformity within a single matching network 16 in terms of efficiency will be increased. That is, prior art impedance matching networks with large tuning ranges often have widely varying impedance values. By decreasing the range as disclosed herein the impedance will vary less from capacitance limits of capacitors 18.

Figure 9:
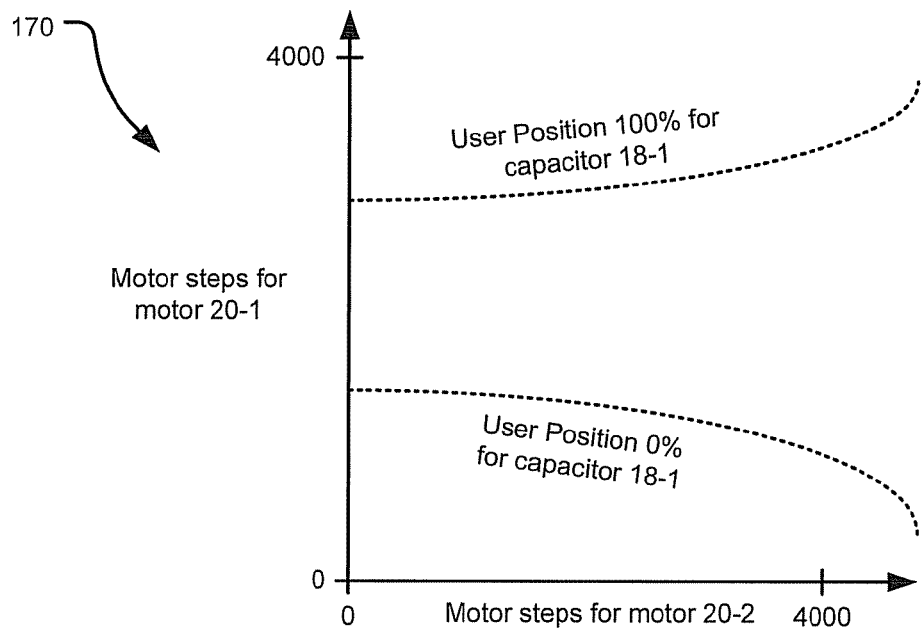
FIG. 9 is a graph that shows a polynomial relationship between desired positions and actual positions of the adjustable tuning capacitors of FIG. 2.

Referring now to FIG. 9, a chart 170 shows that the user position/capacitor position relationships, such as 102, 104, 122, and/or 124 can also have a curve shape. The curve can be implemented in a look-up table or be approximated by a polynomial equation.

Figure 10:
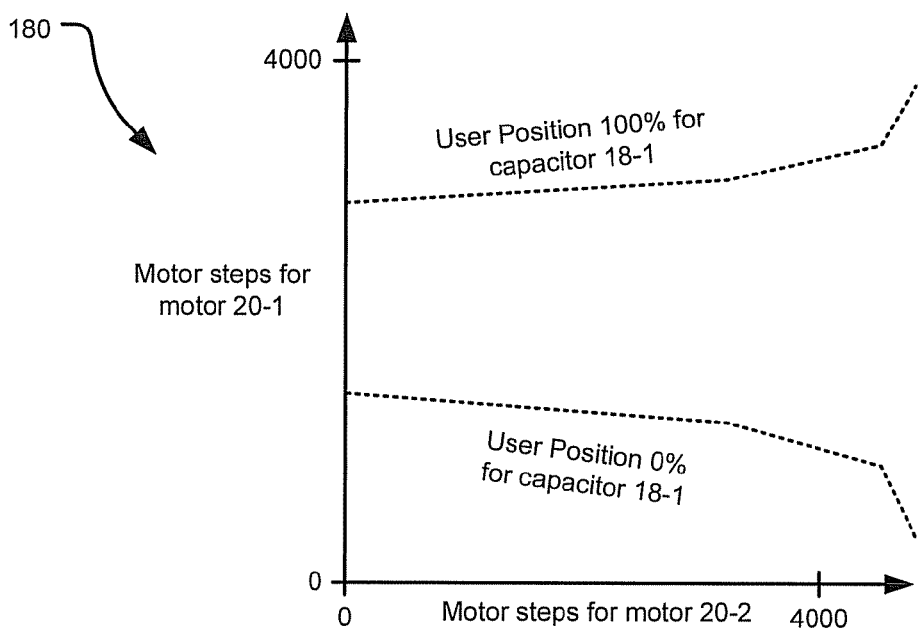
FIG. 10 is a chart that shows a piecewise-linear relationship between desired positions and actual positions of the adjustable tuning capacitors of FIG. 2.

Referring now to FIG. 10, a chart 180 shows that the user position/capacitor position relationships, such as 102, 104, 122, and/or 124 can also be represented by a piecewise linear approximation of a curve. The piecewise linear approximation can be implemented in the look-up table. Each segment of the piecewise linear approximation may also be approximated by respective instances of equations (1)-(3). Each slope and endpoint would then be associated with the slope and endpoints of a respective one of the segments of the piecewise linear approximation.

What is claimed is:

1. An impedance matching network, comprising:
   a first input port that receives radio frequency (RF) power and includes an input impedance;
   an output port that provides the RF power and includes an output impedance; and
   a variable capacitance module that varies the output impedance and comprises
      a first variable capacitor;
      a second variable capacitor;
      a first motor; and
      a second motor that adjusts a capacitance of the second variable capacitor, wherein a relationship between a desired value of the capacitance and an actual value of the capacitance is dependent on a capacitance of the first variable capacitor.

2. The impedance matching network of claim 1 wherein the first and second motors are stepper motors.

3. The impedance matching network of claim 1 wherein the relationship between the desired and actual values of the capacitance is described by a polynomial relationship.

4. The impedance matching network of claim 1 wherein the relationship between the desired and actual values of the capacitance is described by a piecewise linear relationship.

5. The impedance matching network of claim 1 further comprising a control module that determines the desired value based on a portion of the RF power that is reflected from a load that is driven by the output port.

6. The impedance matching network of claim 5 wherein the control module drives the second motor.

7. The impedance matching network of claim 6 wherein the control module includes a lookup table that is stored in a memory and represents the relationship between the desired and actual values of the capacitance.

8. An impedance matching network, comprising:
   a first input port that receives radio frequency (RF) power and includes an input impedance;
   an output port that provides the RF power and includes an output impedance; and
   a variable capacitance circuit that varies the output impedance and comprises
      a first variable capacitor;
      a second variable capacitor;
      a first motor that includes an output shaft that rotates to a first position wherein the first position corresponds with a first capacitance of the first variable capacitor; and
      a second motor that includes an output shaft that rotates to a second position wherein the second position corresponds with a second capacitance of the second variable capacitor and wherein a relationship between a desired value of the first capacitance and an actual value of the first capacitance is dependent on the second position.

9. The impedance matching network of claim 8 wherein a relationship between a desired value of the second capacitance and an actual value of the second capacitance is dependent on the first position.

10. The impedance matching network of claim 8 wherein the first and second motors are stepper motors.

11. The impedance matching network of claim 8 wherein the relationship between the desired and actual values of the first capacitance is described by a polynomial equation.

12. The impedance matching network of claim 8 wherein the relationship between the desired and actual values of the first capacitance is described by a piecewise linear equation.

13. The impedance matching network of claim 8 further comprising a control module that determines the desired value based on a portion of the RF power that is reflected from a load that is driven by the output port.

14. The impedance matching network of claim 13 wherein the control module determines the first and second positions.

15. The impedance matching network of claim 14 wherein the control module includes a lookup table that is stored in memory and represents the relationship between the desired and actual values of the capacitance.

16. A method of operating an impedance matching network, comprising:
   receiving radio frequency (RF) power via an input that includes an input impedance;
   providing the RF power at an output that includes an output impedance; and
   adjusting first and second capacitances to vary the output impedance, wherein a relationship between a desired value of the second capacitance and an actual value of the second capacitance is dependent on the value of the first capacitance.

17. The method of claim 16 wherein adjusting first and second capacitances includes driving respective first and second motors to positions that determine the respective first and second capacitances.

18. The method of claim 16 further comprising determining the desired value based on a portion of the RF power that is reflected from a load that is driven by the output port.

19. The method of claim 16 further comprising storing a lookup table in a computer memory wherein the lookup table represents the relationship between the desired and actual values of the second capacitance.

20. The method of claim 16 wherein the relationship between the desired and actual values of the second capacitance is described by a polynomial relationship.

21. The method of claim 16 wherein the relationship between the desired and actual values of the capacitance is described by a piecewise linear relationship.

* * * * *